United States Patent

[11] 3,581,163

[72] Inventor Lars O. Eriksson
West Chester, Pa.
[21] Appl. No. 719,966
[22] Filed Apr. 9, 1968
[45] Patented May 25, 1971
[73] Assignee General Electric Company

[54] HIGH-CURRENT SEMICONDUCTOR RECTIFIER ASSEMBLIES
8 Claims, 3 Drawing Figs.

[52] U.S. Cl. .......... 317/234R, 317/235r, 317/234p
[51] Int. Cl. .......... H01l 1/02, H01l 1/14
[50] Field of Search .......... 317/234, 235, 234 P

[56] References Cited
UNITED STATES PATENTS

| | | | |
|---|---|---|---|
| 2,933,662 | 4/1960 | Boyer et al. | 317/234 |
| 3,268,309 | 8/1966 | Frank et al. | 317/234X |
| 3,293,508 | 12/1966 | Boyer | 317/234 |
| 3,377,523 | 4/1968 | Andersson et al. | 317/234 |
| 3,457,472 | 7/1969 | Mulski | 317/234 |
| 3,474,302 | 10/1969 | Blundell | 317/234 |

*Primary Examiner*—John W. Huckert
*Assistant Examiner*—Martin H. Edlow
*Attorneys*—J. Wesley Haubner, Albert S. Richardson, Jr., Frank L. Neuhauser, Oscar B. Waddell and Melvin M. Goldenberg

ABSTRACT: The thermal cycling capability of a high-current semiconductor device is significantly increased by disposed a tungsten strain buffer in compression between a terminal of the device housing and an external pressure applying thrust member.

PATENTED MAY 25 1971 3,581,163

INVENTOR:
LARS O. ERIKSSON,

BY Albert S. Richardson Jr.
ATTORNEY

HIGH-CURRENT SEMICONDUCTOR RECTIFIER ASSEMBLIES

This invention relates to improvements in rectifier assemblies including semiconductor devices of the kind wherein broad-area contact between a pair of main electrodes and an interposed semiconductor body is obtained by pressure rather than by solder or the like.

High-current solid-state rectifiers made of semiconductor materials (e.g., silicon) are well known in the art of electric power conversion. For safely conducting forward current of 250 amperes or more, a relatively broad area semiconductor body is required. Typically such a body is in the shape of a thin, disclike multilayer wafer sandwiched between flat metal electrodes that are joined to opposite ends of a hollow insulator to form a sealed housing or package for the wafer. If a 2-layer (PN) silicon wafer is used, the device is a simple rectifier or diode, whereas if a 4-layer (PNPN) wafer with gating means is used, the device is a controlled rectifier known in the art as a thyristor or SCR. For maximum efficiency in either case, it is important that the junctures between opposite faces of the wafer and the respectively adjacent electrodes have the lowest possible electrical and thermal resistance. In practice, however, a reliable low-resistance broad-area contact between these parts of the sealed device is difficult to obtain. The semiconductor wafer will not have precisely the same coefficient of thermal expansion as the adjacent metal electrodes, and as the temperature rises and falls there is consequently a tendency to fracture the juncture therebetween.

The problem of mismatched coefficients of expansion has long been recognized in the art of mounting semiconductors. According to the teachings of U.S. Pat. No. 2,662,997 to Christensen, it is advantageous to mount the silicon wafer on a metallic base member having a coefficient of expansion about the same as that of silicon over the temperature range to which the device is subjected in manufacture and use. Another practice that is becoming increasingly popular for very high-current devices, where intimate contact across a broad area (i.e., larger than 0.5 square inches) must be maintained over a wide range of temperatures (e.g., 150° Centigrade) without damaging the wafer, is to use a pressure, sliding contact design.

In a pressure, sliding contact design, no solder or other bonding agent or means is used to secure the semiconductor body between the main electrodes of the device. Instead, these parts are held under pressure in face-to-face slidable engagement with each other, whereby they are theoretically free to expand at different rates as the operating temperature rises. See for example U.S. Pat. No. 3,221,219 to Emeis et al. which discloses a semiconductor device wherein a nickel surface is in pressure sliding engagement with a silver surface.

It has been found from experience that the frictional forces that accompany sliding of the pressure contact interfaces are great enough to excessively strain the silicon wafer in high-current devices subject to severe temperature cycling. Accordingly, it is a general objective of the present invention to overcome this problem.

A more specific objective of my invention is to increase the reliability and the life of a high-current semiconductor rectifier device in a manner that is characterized by its classic simplicity and its surprising effectiveness I accomplish these objectives by using a hybrid combination the preferred form of which the now be summarized. A silicon wafer enclosed in a sealed housing is bonded on one side to a tungsten substrate in a conventional manner. The other side of the wafer, through an intermediary layer of gold or the like, is disposed in pressure contact with an adjoining terminal member or electrode of the housing. This electrode is made of relatively thin, ductile metal such as copper, but during a thermal cycle sliding movement by the copper electrode relative to the silicon wafer is constrained by providing outside the housing a strain buffer of tungsten or the like contiguous with the external surface of the electrode. The external strain buffer is separably disposed in compression between the associated electrode and a thrust member of a cooperating pressure assembly. By adding this strain buffer I have been able materially to extend the thermal cycling life of the device without appreciably reducing its surge current rating.

My invention will be better understood and its various objects and advantages will be more fully appreciated from the following description taken in conjunction with the accompanying drawing in which.

Figure 1:
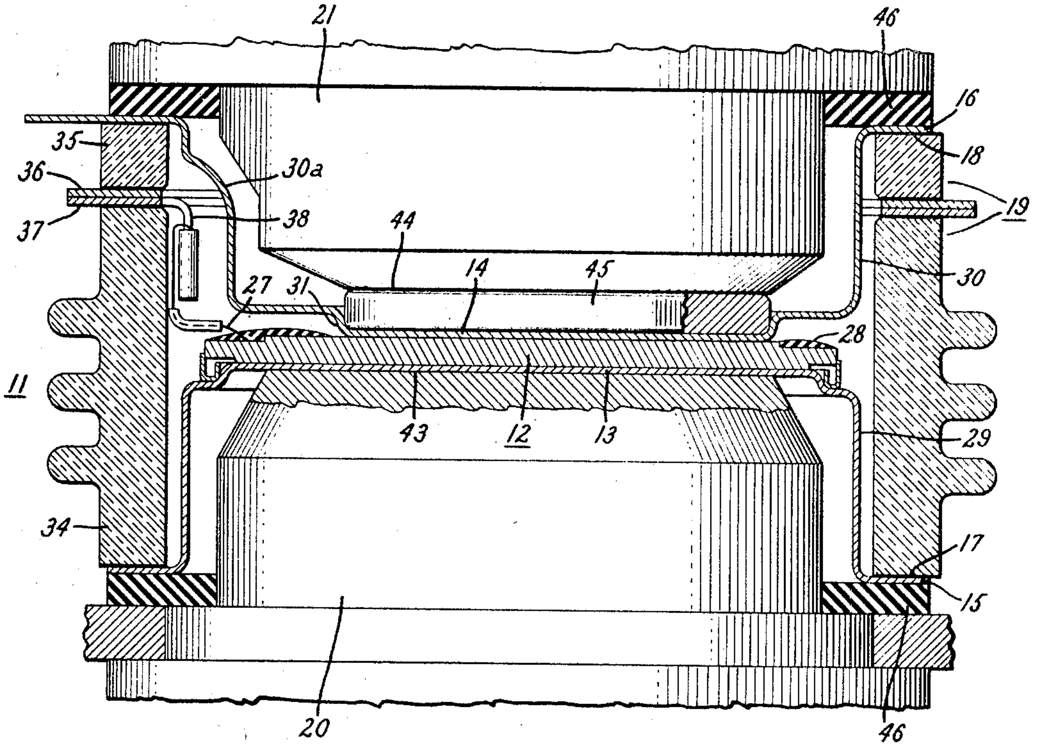
FIG. 1 is a magnified elevational view, in section, of a high-current semiconductor rectifier device in a combination that embodies my invention.

The high-current semiconductor rectifier device 11 shown in FIG. 1 will now be described in detail, with the understanding that, except where otherwise indicated below, a plan (horizontal) view of the device would reveal that its various parts are circular. The device itself is not my invention; certain features of it are the claimed subject matters of earlier patent applications such as Ser. No. 585,428 filed on Oct. 10, 1966, for F. R. Sias and assigned to the General Electric Company. The present specification will conclude with claims that point out the particular combination I regard as my invention.

The device 11 is seen to include a disclike body 12 sandwiched between the flat bottoms 13 and 14 of a pair of cup-shaped terminal members whose rims 15 and 16 are bonded, respectively, to opposite ends 17 and 18 of a hollow electrical insulator 19 to thereby form an integral, hermetically sealed housing for the body 12. This device, as illustrated, is mounted under pressure between the opposing ends of a pair of force-transmitting electroconductive thrust members or posts 20 and 21 that serve as combined electrical and thermal conductors.

Figure 2:
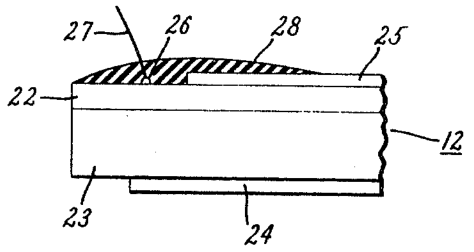
FIG. 2 is an enlarged fragmentary detail of the semiconductor body that is enclosed in the device shown in FIG. 1.

The interior disclike body 12 of the device 11 is made of semiconductor material. More specifically, as indicated in FIG. 2, it preferably comprises a thin (e.g., 12 mils), relatively broad area, circular slice of asymmetrically conductive silicon 22 on a thicker (e.g., 60 mils) disclike substrate 23 of tungsten or molybdenum with a facing 24 of gold-nickel (e.g., 94 percent gold, 6 percent nickel) or the like on the 8c distal end of the substrate 23 and a thin metal contact 25 overlaying the top surface of the silicon 22. Preferably the contact 25 consists essentially of gold, but alternative metals such as silver, aluminum, indium, rhodium, or nickel are also practical, as are alloys of any of these metals. Theoretically the metal face 25 can be omitted altogether.

The body 12 can be constructed by any of a number of different techniques that are well known in the art today. Its diameter typically is 1.25 inches. Internally, the silicon wafer 22 will have at least one broad area PN rectifying junction generally parallel to its faces. The device shown for illustration purposes is actually a thyristor (i.e., a controlled rectifier), and its wafer is therefore characterized by four layers of alternately P and N type conductivity, one of which is provided with a peripheral gate contact 26 to which a flexible gate lead 27 is ohmically connected. It will be assumed that a P layer of 22 is ohmically connected to the substrate 23, whereby the forward direction of conventional current through the body 12 is from the main contact 24 to the main contact 25. These contacts will be ground and lapped to produce opposite faces that preferably are parallel to each other and perpendicular to the axis of the body 12. A protective coating 28 of insulation (e.g., silicone rubber) is then deposited on the annular area of the body 12 radially beyond its upper face 25 and on the part of this face that is adjacent to the peripheral gate contact 26.

As can be seen in FIG. 1, the opposite faces of the body 12 respectively adjoin and are in pressure contact with opposing plane surfaces of the parallel bottoms 13 and 14 of the spaced-apart terminal members of the device 11. These parts conduct load current between the posts 20 and 21 and the interior body 12 and therefore serve as the main electrodes to the device (hereinafter referred to as anode 13 and cathode 14).

Each is relatively thin (e.g., 15 mils) and ductile, being made of highly conductive metal such as silver, aluminum, brass, or copper, preferably the latter. For best results both the anode 13 and the cathode 14 are plated or coated with very thin layers of nickel, or alternatively of silver or gold.

The anode 13 is joined to the insulator 19 by means of a sidewall 29 integrally connected to the flared rim 15 which in turn is attached by brazing or the like to a metallized lower end 17 of the insulator. Thus the components 13, 15, and 29 comprise the cup-shaped terminal member whose sidewall 29 is part of a somewhat elastic angular diaphragm extending inside the hollow insulator 19 as shown. A generally similar terminal member is formed by the cathode 14, the rim 16, and an interconnecting sidewall 30, except that the latter is noncircular because a portion 30*a* of this sidewall is indented to form an enlarged pocket for connecting the lead 27 to ring gate as described below. It will also be observed that unlike the circular anode 13 the cathode 14 is generally D-shaped due to a peripheral segment being omitted from its left side 31, whereby the internal surface of the cathode adjoining the upper face of the body 12 is correspondingly relieved in the vicinity of the peripheral gate contact 26.

In order to make the interior gate lead 17 externally accessible, the device 11 also includes a control electrode 33 traversing the insulator 19. The insulator 19, as is plainly shown in FIG. 1, actually comprises two axially aligned rings 34 and 35 having the same inside diameter. These rings preferably are ceramic. The part 35, whose metallized upper end 18 is brazed to the rim 16 of the cathode terminal member of the device 11, has only a short axial dimension, whereas the part 34 comprises a relatively long cylinder or sleeve surrounding not only the anode 13 and the semiconductor body 12 but also the cathode 14 and the bottom half of the sidewall 30 associated therewith. The two ceramic parts 34 and 35 are joined together by means of a metal ring 36 and the control electrode 33 which is also ring-shaped. The ring 33 is bonded to the metallized upper end of the ceramic sleeve 34 and protrudes annularly beyond it, while the metal ring 36 is bonded to the metallized lower end of the ceramic ring 35 and similarly protrudes annularly beyond it. The contiguous metal rings 33 and 36 are welded together around their outer perimeters to complete the hermetically sealed housing for the semiconductor body 12. Preferably this is done in an inert atmosphere, whereby oxygen and other undesirable gases are permanently excluded from this housing. Inside the housing the gate lead 27 is connected to a conductive tab 38 of the control electrode 33 as shown.

The semiconductor body 12 is held mechanically between and electrically in series with the main electrodes 13 and 14 of the device 11 by pressure. No solder or other means is used for bonding these parts together. Electric contact between the metal faces of the body 12 and the adjoining internal surfaces of the respective electrodes is effected merely by their pressure engagement with each other over the generally circular interface area. This pressure is provided in the first instance by the elastic nature of the anode and cathode terminal members that are disposed on opposite sides of the device 11. In addition the anode 13 and the cathode 14 of the illustrated device are firmly pressed toward one another by means of the external posts 20 and 21, whereby an even more intimate high-current, low-resistance interface connection is obtained. Any suitable external pressure mounting arrangement can be used for axially compressing the set of posts 20 and 21. A particularly advantageous assembly for this purpose is disclosed and claimed in copending patent application Ser. No. 577,034 filed on Sept. 2, 1966, for F. R. Sias and assigned to the General Electric Company (now U.S. Pat. No. 3,471,757).

The associated thrust members or posts 20 and 21 are generally cylindrical in shape, and they are made of highly conductive metal such as aluminum, brass, or copper, preferably the latter. They stem from broader members or heat sinks of like material and are appropriately tapered to fit freely inside the cup-shaped terminal members of the device 11 where their opposing ends are terminated by parallel, flat surfaces 43 and 44, respectively. The surface 43 of post 20 abuts the external contact surface of the anode 13 of the device 11 as shown. The surface 44 of post 21 is adjacent to the external contact surface of the cathode 14, and my strain buffer 45 is disposed therebetween. For best results the post ends are coated with very thin layers of silver, or alternatively of nickel or gold. To help mechanically stabilize the device 11 and to prevent dust and other contaminators from entering the space around the copper posts 20 and 21, a washer 46 of yieldable material is located in the gap between each end of the insulator 19 and the respectively adjacent heat sink.

When the high-current device 11 is mounted between the copper posts 20 and 21 as shown in FIG. 1, its anode 13 and cathode 14 are tightly squeezed against the interposed disclike semiconductor body 12. High pressure (e.g., 3,000 p.s.i.) is uniformly exerted on the contiguous contact surfaces of these parts, thereby ensuring good electrical and thermal conductivity across their broad-area junctions. However, the body 12 is not constrained radially except by friction.

In operation the device 11 will be subject to temperature cycles that cause dimensional changes therein. Because the cathode 14 is not made of the same material as the adjoining semiconductor body 12, these parts have different coefficients of thermal expansion, and consequently their interengaging contact surfaces tend to rub each other. Such interface rubbing or sliding mechanically stresses the silicon wafer 22 and can in time cause fatigue cracks or other serious damage. As a result, both the number of repetitive thermal cycles and the maximum temperature excursion per cycle that prior art high-current devices can successfully withstand without failure are undesirably limited. In order to improve thermal cycling capability, I have added a strain buffer 45 in compression between the external surface of the cathode 14 and the opposing surface 44 of the copper post 21.

The strain buffer 45 is a generally disc-shaped piece of hard metal whose coefficient of expansion is approximately the same as that of the semiconductor body 12 over the temperature range to which the device 11 is subjected in use. The base material of the buffer can be selected from the group consisting of tungsten, molybdenum, chromium, and alloys composed principally of iron and nickel and known popularly as ferni or fernico or kovar. In the presently preferred embodiment of my invention, tungsten is used because it has better thermal and electrical conducting properties. Like the cathode 14, the buffer 45 is preferably provided with a plating or coating of nickel, or of silver or gold.

Figure 3:
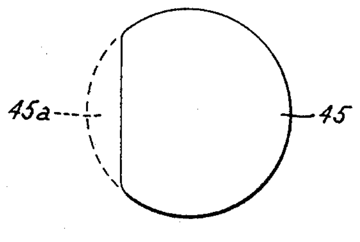
FIG. 3 is a reduced plan view of the strain buffer employed in the combination shown in FIG. 1.

The tungsten strain buffer 45, which is much thicker than the copper cathode 14 (e.g., 5 times), is discrete and separable from the device 11 and is not metallurgically bonded to the adjoining cathode. Its lower face substantially conforms to and is contiguous with the external contact surface of the cathode 14. For the illustrated thyristor the buffer 45 is therefore D-shaped as shown in FIG. 3; for a diode having a circular cathode the corresponding buffer would, of course, include the broken-line segment 45*a*. A very thin film of inert lubricating fluid such as silicone oil is preferably disposed in the buffer-cathode interface to promote smoother sliding motion, to inhibit oxidation of the interengaging surfaces, and to reduce adhesion thereof. For the same reasons silicone oil is used between the buffer 45 and the surface 44 of the copper post 21 unless, as may sometimes be the case, the buffer is brazed or otherwise attached to the distal end of the post.

The cathode 14 of the device 11 is tightly squeezed between the internal semiconductor body 12 and the external strain buffer 45, and because it is thin and ductile it tends to assume the thermal expansion properties of these adjoining parts. In particular the internal surface of the cathode and the gold face 25 of the body 12 are likely to merge. As a result, surface excursions of the cathode relative to the semiconductor body are effectively constrained, and the surface integrity of the silicon wafer 22 is preserved. The face of the strain buffer that is contiguous with the cathode has rounded edges to prevent crushing or cracking the silicon wafer under the buffer perimeter.

The addition of the strain buffer 45 outside the housing of the semiconductor device 11 materially improves the thermal cycling capability of the device without appreciably degrading its thermal and electrical characteristics. More specifically, tests have shown a nearly 100-fold increase in life (measured in number of thermal cycles of a given temperature range) with only a 1.5 percent increase in transient thermal resistance. Compared to locating a strain buffer inside the sealed housing between the semiconductor body and the cathode, my invention is superior for several reasons. Thermally it is advantageous to have the cathode rather than the buffer next to the semiconductor body because the cathode is made of copper whose specific heat is about three times higher and whose density is less than one-half that of tungsten. In addition, the area of contact will be broader, and the cathode is more likely to fuse with the gold face 25 of the semiconductor body thereby lowering the thermal resistance of this juncture which is proximate to the source of heat. Furthermore, there is no risk of the buffer being physically displaced from its proper position between the step of sealing the device 11 and the subsequent step of mounting it under pressure in a complete assembly. The external buffer 45 also provides a desirable degree of flexibility; without modifying the structure of the basic device 11 the buffer can optionally be omitted altogether (and replaced by a copper spacer having the same dimensions) in those cases where the specified thermal cycling duty of a device is not severe enough to warrant its use. In this connection it should also be noted that where the thermal cycling duty permits it will be advantageous from a surge rating point of view to make the copper cathode 14 appreciably thicker than shown (e.g., twice as thick) or to make the tungsten buffer 45 appreciably thinner.

While I have shown and described a preferred form of my invention by way of illustration, many modifications will undoubtedly occur to those skilled in the art. I therefore contemplate by the claims that conclude this specification to cover all such modifications as fall within the true spirit and scope of the invention.

I claim:

1. In combination:
  a. a semiconductor rectifier device including a sealed housing having first and second main electrodes on opposite sides thereof;
  b. means including an electroconductive thrust member opposing an external contact surface of said first electrode for pressing said electrodes toward one another; and
  c. a discrete strain buffer located outside of said housing and disposed between said thrust member and said first electrode, said strain buffer being contiguous with the external contact surface of said first electrode and being made of a material whose coefficient of expansion is approximately the same as that of silicon over the temperature range to which the combination is subjected in use, said strain buffer being unbonded to either said thrust member or said first electrode.

2. The combination of claim 1 in which said strain buffer has a face substantially conforming to the contact surface with which it is contiguous and said face has rounded edges.

3. The combination of claim 1 in which said rectifier device includes a semiconductor body sandwiched between said electrodes inside said housing.

4. The combination of claim 3 in which the base material of said first electrode and of said thrust member is selected from the group consisting of silver, copper, brass, and aluminum, and in which the base material of said strain buffer is selected from the group consisting of tungsten, molybdenum, chromium, and alloys composed principally of iron and nickel.

5. The combination of claim 4 in which said semiconductor body has a metal face adjoining and in pressure contact with the internal surface of said first electrode, said metal face being selected from the group consisting of gold, silver, aluminum, indium, rhodium, nickel, and alloys thereof.

6. The combination of claim 5 in which said first electrode and said strain buffer are each coated with a metal selected from the group consisting of gold, silver, and nickel.

7. In combination:
  a. a semiconductor device comprising:
    i. first and second spaced-apart main electrodes of relatively thin, ductile metal,
    ii. a semiconductor body sandwiched between said electrodes, and
    iii. means including an insulating member for mechanically joining said electrodes to form a sealed housing for said body;
  b. means for compressing said electrodes and the interposed semiconductor body comprising a force transmitting electroconductive member adjacent to an external surface of said first electrode; and
  c. a discrete strain buffer of relatively hard metal having a coefficient of expansion approximately the same as that of said semiconductor body, said buffer being located outside said housing between said first electrode and said force transmitting member.

8. The combination of claim 7 in which said main electrode and said force transmitting member are made of copper and said strain buffer is made of tungsten.